United States Patent
Rinck et al.

(10) Patent No.: US 10,656,226 B2
(45) Date of Patent: May 19, 2020

(54) MAGNETIC RESONANCE APPARATUS AND METHOD FOR CONDUCTING MAGNETIC RESONANCE EXAMINATION OF A PATIENT

(71) Applicant: Siemens Healthcare GmbH, Erlangen (DE)

(72) Inventors: Daniel Rinck, Forchheim (DE); Stefan Popescu, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 61 days.

(21) Appl. No.: 15/983,369

(22) Filed: May 18, 2018

(65) Prior Publication Data
US 2018/0335492 A1    Nov. 22, 2018

(30) Foreign Application Priority Data

May 19, 2017    (EP) .................................. 17171951

(51) Int. Cl.
*G01R 33/385* (2006.01)
*G01R 33/28* (2006.01)
(Continued)

(52) U.S. Cl.
CPC ......... *G01R 33/3854* (2013.01); *G01R 33/28* (2013.01); *G01R 33/288* (2013.01);
(Continued)

(58) Field of Classification Search
CPC .... G01R 33/28; G01R 33/283; G01R 33/288; G01R 33/3852; G01R 33/3854; G06F 3/165; G10H 1/0066
See application file for complete search history.

(56) References Cited

U.S. PATENT DOCUMENTS

2005/0273000 A1* 12/2005 Dinehart ............... A61B 5/055
                                                        600/410
2011/0142250 A1    6/2011 Schmale et al.
(Continued)

FOREIGN PATENT DOCUMENTS

WO    WO-2012069979 A1    5/2012

OTHER PUBLICATIONS

Ma et al., "Music-Based Magnetic Resonance Fingerprinting to Improve Patient Comfort During MRI Examinations," Magnetic Resonance in Medicine, vol. 75, pp. 2303-2314 (2016).
(Continued)

*Primary Examiner* — Rishi R Patel
(74) *Attorney, Agent, or Firm* — Schiff Hardin LLP

(57) ABSTRACT

A magnetic resonance (MR) apparatus for implementing an MR examination of a patient, has an MR scanner with a gradient coil arrangement and a music network having at least two communicating instrument devices, synchronized by synchronization signals sent via the music network, so as to generate a music piece that is to be emitted as an output to the patient. One of the instrument devices is the magnetic resonance scanner that, as an interface to the music network, has a synchronization unit designed to derive the synchronization signals for the music network from sequence control signals received from the control computer of the magnetic resonance scanner, at least for the gradient coil arrangement.

18 Claims, 2 Drawing Sheets

(51) Int. Cl.
*G06F 3/16* (2006.01)
*G10H 1/00* (2006.01)
(52) U.S. Cl.
CPC ......... *G01R 33/3852* (2013.01); *G06F 3/165* (2013.01); *G10H 1/0066* (2013.01); *G01R 33/283* (2013.01)

(56) References Cited

U.S. PATENT DOCUMENTS

| | | | |
|---|---|---|---|
| 2015/0108979 A1* | 4/2015 | Park | G01R 33/5611 324/309 |
| 2015/0331659 A1* | 11/2015 | Park | G10H 1/0083 700/94 |
| 2016/0124061 A1 | 5/2016 | Grodzki | |

OTHER PUBLICATIONS

Popescu, "MR synchronous music," Siemens AG; Sperrveröffentlichung (2012).

* cited by examiner

MAGNETIC RESONANCE APPARATUS AND METHOD FOR CONDUCTING MAGNETIC RESONANCE EXAMINATION OF A PATIENT

BACKGROUND OF THE INVENTION

Field of the Invention

The invention concerns a magnetic resonance apparatus for the magnetic resonance examination of a patient, the magnetic resonance apparatus comprising a magnetic resonance scanner having a gradient coil arrangement. The invention further relates to a method for operating such a magnetic resonance apparatus.

Description of the Prior Art

Magnetic resonance imaging is an established medical imaging modality for scanning patients, which is suitable for use in numerous application areas. Gradient coils of a gradient coil arrangement of the magnetic resonance scanner are employed for spatially encoding the magnetic resonance signals. In order to be able to generate the strong currents necessary for that purpose, a gradient coil arrangement typically also has power amplifiers. Due to the strong, rapidly changing currents of the gradient coil arrangement, severe noise emission levels are produced in magnetic resonance scanners, which noise levels are perceived by many patients as extremely disturbing, in particular also due to the relatively long examination times, and can intensify feelings of oppression and a state of anxiety experienced by patients, due to the constricted space, for example. Magnetic resonance sequences following one another in quick succession at different noise levels, for example an EPI sequence following a TSE sequence, can alarm the patient and also lead to motion artifacts.

Although various approaches exist to reduce noise emission during a magnetic resonance examination, a complete reduction appears rather unlikely according to the current state of the art. Headphones are often used in the prior art in order to reduce and/or compensate for the sound pressure of the noises of the gradient coil arrangement when an active attenuation of noise is to take place.

It has also been proposed in the prior art to play music in order to make the time spent by patients in a magnetic resonance scanner more pleasant during the magnetic resonance examination, in which case commercial and/or other music pieces, for example, can be used that are superimposed on the noise level in the magnetic resonance scanner. Published PCT Application WO 2012/069979 A1, for example, proposes playing music to mask noises of the gradient coil arrangement. At the same time, the music played is supported by video images that are intended to distract the patient's attention from the noises of the magnetic resonance device and encourage the patient to concentrate on the superimposed music. It is therefore proposed therein to distract the patient's attention as effectively as possible from the noises of the magnetic resonance device.

In the publication "MR Synchronous Music" by Dr. Stefan Popescu, published in Journal Technik Up2date #06 and also available on the internet, DOI: 10.4421/PAP-DEOTT001085, the contents of which are incorporated herein by reference, it is proposed to combine the noises of the gradient coil arrangement typically generated by the magnetic resonance device with a special supplementary noise output, in such a way that overall a harmonic noise or a harmonic piece of music is produced. This proposal is based on the practical observation that, in contrast to loudly hammering or banging acoustic noises, loud harmonic noises or loud music do not act as stress-inducing on patients, but rather as relaxing. Furthermore, the loud harmonic noises or loud music are less dangerous for human hearing, at least when they take place only over a limited period of time. The proposed solution is based on harmonic synchronization and sound pressure matching, which are both optimally combined in order to enable harmonic acoustic effects or a known music piece to be created. The magnetic resonance noises are therefore not used in a superimposed or covering manner, but are used as part of the loud harmonic noises or music, for example as contributors to the beat, rhythm or tempo of the overall melody. In concrete terms, it is proposed to populate a multidimensional model of a harmonic noise with contributions of basic musical descriptors which can be derived by Fourier analysis from the gradient coil noises of the magnetic resonance device, so that then, on the basis of this model, a music database can be searched for a harmonically compatible music piece. Patient preferences can be taken into consideration.

Problems arise in the application of this proposal, since most known music pieces are composed with a certain meter, 120 beats per minute, for example, which makes a synchronization significantly more difficult, in particular when characteristic times of the MR data acquisition sequence, such as the repetition time TR, change within the acquisition protocol of the magnetic resonance device, or are adjusted from patient to patient.

SUMMARY OF THE INVENTION

An object of the invention is to provide a way to synchronize noises of a gradient coil arrangement and noises supplementing those gradient noises, which can be used even in the case of frequently changing and/or resulting meters of the noises of the gradient coil arrangement that cover a wide range.

This object is achieved according to the invention by a magnetic resonance apparatus of the type described in the introduction, wherein the magnetic resonance apparatus additionally has a music network having at least two communicating instrument devices, synchronized by synchronization signals sent via the music network, in order to generate a music piece that is emitted as an output to the patient in the scanner, wherein one of the instrument devices is the magnetic resonance scanner which, as an interface to the music network, has a synchronization unit that derives synchronization signals for the music network from sequence control signals received from the control computer of the magnetic resonance scanner, these sequence control signals being control signals at least for the gradient coil arrangement.

According to the invention, therefore, the magnetic resonance scanner is integrated as an instrument device into a music network, so that the totality of instrument devices that are present generates a loud harmonic noise or a loud harmonic music piece using the noises of the gradient coil arrangement, i.e. the noises of the magnetic resonance examination that are present anyway are incorporated into an overall acoustic environment or experience that helps calm the patient and protect the patient's hearing. In this case, a synchronization unit is used that generates a musical synchronization signal from a magnetic resonance internal trigger pulse, i.e. local sequence control signals, by which musical synchronization signal further instrument devices, as external tone generators, can emit noises synchronously with a magnetic resonance protocol or a magnetic resonance sequence. In this case the sequence control signal, as a magnetic resonance device internal trigger pulse, is inherently synchronized with the sequence framework.

In other words, the magnetic resonance scanner, in which the knowledge about the resulting noises of the gradient coil arrangement thereof resides, can be used as a kind of "clock master" (metronome) for synchronizing the instrument devices of the music network. This enables synchronized music matched to the magnetic resonance sequence or the magnetic resonance protocol to be generated, which can be understood as a type of "magnetic resonance soundtrack". The synchronization unit, as an interface to the music network, generates the synchronization signal, which can also be understood as a clock signal, and ensures that a specific acoustic pattern is always played at the right point in time, i.e. an optimal correspondence is given with the noise of the gradient coil arrangement that results within the scope of the magnetic resonance protocol. This permits a significantly more pleasant feeling to be imparted to the patient during the magnetic resonance examination and permits the patient's hearing to be protected as well.

The music network is advantageously operated using a standardized communications protocol. It is preferred in this case for communications in the music network to be handled in accordance with the MIDI standard. The MIDI standard has become established in the music industry over recent decades. Starting from sequence control signals, a MIDI TIMING CLOCK signal can then be generated as the synchronization signal within the scope of the invention. This synchronization signal can be sent (emitted) for example 24 times or 48 times per quarter note. The speed at which the noises or tones to be added to the noises of the gradient coil arrangement are played can be synchronized via this MIDI TIMING CLOCK signal.

The control computer preferably has a sequence controller that transmits the sequence control signals embodied in particular as TTL trigger signals. Sequence control units as subunits of a control device of a magnetic resonance device can also be referred to as "sequence and timing controllers". According to the invention, the sequence control signals as an output therefrom use not only subsystems of the magnetic resonance device that are familiar with the playback of the magnetic resonance sequence, but also the synchronization unit, which moreover may also be embodied as part of the control computer. Since the sequence control signals, which represent the trigger signals for further components of the magnetic resonance scanner, directly describe how and when the gradient coil arrangement is controlled (activated), it also follows therefrom that the sequence control signals evaluated by the synchronization unit describe noises generated by the gradient coil arrangement that are to be used in the music piece.

In an embodiment of the present invention, the synchronization unit is designed to generate music control signals on other instrument devices of the music network, as or in addition to the synchronization signals. Thus the magnetic resonance scanner, as an instrument device in the music network, assumes not only the role of a clock master, but also the role of a master overall (in the circuit sense), wherein the at least one further instrument device takes on the role of a slave (in the circuit sense). Control signals can in this case exhibit numerous complexities. Synchronization signals, which also serve as music control signals, in this case include, for example, start signals, stop signals, signals indicating a position pointer, pause signals and continue signals. If the MIDI standard is used, corresponding START, STOP and CONTINUE signals, for example, exist in this case, which signals can be used accordingly in order, for example, to stop and restart a tone generator synchronously if the magnetic resonance examination is interrupted. In general, the music control signals can include a start command and/or an end command and/or a pause command and/or a continue command, wherein the synchronization unit for generating the music control signals is designed in unison with the execution of different gradient noise segments in a sequence execution, which can correspond to sequence segments or individual magnetic resonance sequences with a fixed repetition time.

The magnetic resonance scanner therefore controls the other instrument devices in the music network in order to generate, in conjunction with the noises of the gradient coil arrangement, an overall acoustic, harmonic mixture or combination, in particular a music piece or compilation. Further control signals in this context can also describe the noises to be emitted by the at least one further instrument device itself, for example as tones/music notes/chord progressions, and the like.

In a preferred embodiment of the present invention, the control computer and/or the synchronization unit are/is designed to determine music pieces that are to be played using noises of the gradient coil arrangement, and the synchronization unit is designed to emit music control signals describing the music pieces and/or the noises of the music piece currently to be emitted by the at least one further instrument device. The musical contents of the overall acoustic experience therefore can be determinable by the control device and/or the synchronization unit, and the at least one further instrument device can be controlled accordingly using the music network in order actually to obtain the overall acoustic mixture as a music piece. In this case two basic embodiments are conceivable for how the music piece, and consequently the noises to be emitted by the further instrument device, can be determined.

In a first embodiment, the music piece is selected from a database as a function of gradient pulses that are to be generated. In this case, the noises of the gradient coil arrangement that will be generated due to the gradient pulses that are known in advance in the context of a magnetic resonance examination, are already precalculated and analyzed, for example by a Fourier transform, in order to obtain basic musical descriptors, in particular beat, tempo, pitch and/or rhythm. Using these musical descriptors, a model is then produced that can be used in a correspondingly annotated musical database in order to find a matching music piece that also has or can use the corresponding descriptors in order to realize an overall harmonic acoustic mixture through the addition of further noises.

In another embodiment, the music piece is generated by a generation algorithm executed in the control computer of the magnetic resonance scanner as a function of the gradient pulses that are to be activated. In this case the musical content is therefore generated automatically, with the use of appropriate generation algorithms that exist in the prior art, for example under the name "Arpeggiator". It is also known to generate melodic phrases based on specified/generated chord sequences, for example the KARMA music worktool that is commercially available from Cork Industries.

In another embodiment of the present invention, the synchronization unit is designed to generate and emit a music control signal that increases the volume of the output of the at least one further instrument device in a smooth progression, in preparation for a predetermined jump in volume of the noises of the gradient coil arrangement. This can be done such that, at the point in time of the jump, the volume of the further instrument device has at least substantially reached the volume of the noise of the gradient coil arrangement that follows the jump in volume. The volume can be increasable in this case in a linearly increasing manner With this type of control, the musical content that is emitted by the music network overall can be modified so that extreme jumps in volume, for example between two magnetic resonance sequences, can be "anticipated" acoustically, which means that prior to the actual jump in volume due to the gradient coils, the patient's ears are already prepared for the coming increase in volume. An acoustic impedance matching to the human ear therefore takes place. In this way it is possible to prevent the patient from being alarmed and as well as to avoid patient movements potentially caused by this. In a smooth progression, the amplitude, i.e. volume, is smoothly adjusted prior to the transition to a new magnetic resonance sequence or, as the case may be, to some other jump in volume in order to prepare the patient's ears for the jump in volume.

In a preferred embodiment of the invention, the synchronization unit is designed to match the rate of the output of the synchronization signals as a function of a tempo of the pulse of the music piece, starting from the repetition time described by the sequence control signals, such that the time interval of the output of the synchronization signals is a multiple of the repetition time, or vice versa. The synchronization unit accordingly implements a rate matching between the sequence timing, in particular described by the repetition time, and the basic rhythm of the music piece ("natural beat clock"). This means that when the repetition time or the repetition rate resulting therefrom is higher than the "beat clock", the synchronization unit implements a division, i.e. a rate reduction, and for example generates a synchronization signal only every n repetition times, where n is a natural number. For example, n can be equal to 2, 3 or even 10. However, if the repetition rate resulting from the repetition time is significantly lower than that of the music piece, the synchronization unit implements a multiplication of the repetition time rate in order to generate, for example using a PLL (Phase-Locked Loop) circuit, n uniformly distributed synchronization signals in the time period between two repetition time sequence control signals, where n is once again a natural number and can be equal to 2, 3 or 10, for example.

In a further embodiment of the present invention, at least one light generation device that evaluates signals of the synchronization unit in order to generate light is also connected to the music network. The synchronization signals thus can be used also to control a space lighting device, for example, and/or a projection device, for example a so-called "mood display", which has not been used to date in the prior art in a synchronized manner for the magnetic resonance examination. In functional magnetic resonance imaging, in which the response to specific external stimulations may be a significant factor, visual stimulations, in particular consistent with the music piece, may also be faded in by appropriate actuation of a light generation device. It is therefore conceivable to generate corresponding emotional states by way the described tight coupling between the magnetic resonance sequence and the audiovisual stimulation, if this is helpful to the magnetic resonance examination.

In a specific implementation, the synchronization unit has an FPGA circuit that processes the control signal and/or a microcontroller that processes the sequence control signal, each of which has a UART. A UART (Universal Asynchronous Receiver/Transmitter) permits a realtime conversion of the sequence control signals to the synchronization signals and/or, where applicable, music control signals. Accordingly, at least one further instrument device can be an audio amplifier and a speaker connected thereto.

In addition to the magnetic resonance apparatus, the present invention also concerns a method for operating a magnetic resonance apparatus of the inventive type described above, wherein the synchronization unit derives synchronization signals for the music network from sequence control signals received from the control computer of the magnetic resonance scanner, at least for the gradient coil arrangement. All statements made above with regard to the magnetic resonance apparatus according to the invention are applicable analogously to the method according to the invention, such that the cited advantages can also be obtained by this method.

DESCRIPTION OF THE PREFERRED EMBODIMENTS

Figure 1:
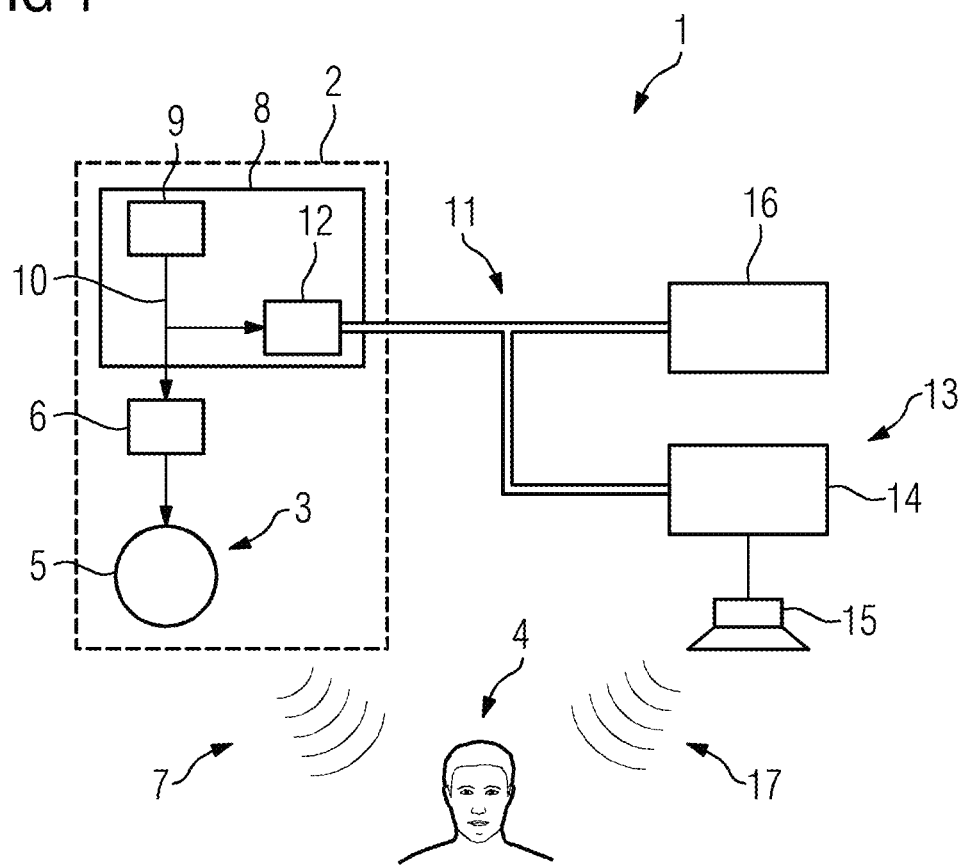
FIG. 1 schematically illustrates a magnetic resonance apparatus according to the invention.

FIG. 1 schematically illustrates a magnetic resonance apparatus 1 according to the invention. For clarity of illustration, in particular with regard to the magnetic resonance scanner 2, further commonly known components that are less relevant to the invention are not shown, in particular the basic field magnet, the radio-frequency (RF) coil system, the patient support and positioning system, and the like.

In order to enable magnetic resonance data of a patient 4 to be acquired, the magnetic resonance scanner 2 has a gradient coil arrangement 3 with gradient coils 5 and a power electronics circuit 6 that includes a gradient waveform synthesizer and power amplifier. During operation of the gradient coil arrangement 3 in the course of a magnetic resonance examination, i.e. when parts of a magnetic resonance sequence are applied, regular loud noises 7 are generated. A magnetic resonance protocol that includes at least one magnetic resonance sequence is implemented in a control computer 8 of the magnetic resonance scanner 2. The control computer 8 has, for the realtime actuation of components of the magnetic resonance scanner 2, including the gradient coil arrangement 3, a sequence controller that emits corresponding sequence control signals, in this case as TTL trigger signals, as indicated by the arrow 10.

In order to make both the acoustic and the general atmosphere more pleasant for the patient 4, and to protect the patient 4, in particular the patient's hearing, the magnetic resonance scanner 2 is connected, as a first instrument device, to a music network 11. The interface to the music network 11, in this case a MIDI network, is formed by a synchronization unit 12 that in the present example is part of the control computer 8. The synchronization unit 12 receives at least sequence control signals directed to the gradient coil arrangement 3 and converts these into synchronization signals and/or control signals conforming to the MIDI standard, which signals are forwarded into the music network 11, where they serve for synchronization with at least one further instrument device 13, which in this case is formed by an audio amplifier 14 and a speaker 15, as well as a light generation device 16, in particular a projection device and/or a mood lighting device.

When the magnetic resonance scanner 2 is operated by the synchronization unit 12, in the present example the synchronization unit 12 serves not only as a clock master, but also as a master circuit overall, in which case the at least one further instrument device 13 and the light generation device 16 are to be regarded as slave circuits.

In this regard, the synchronization unit 12 also generates music control signals in unison with a sequence execution. The synchronization signals and/or music control signals forwarded into the music network 11 represent MIDI realtime messages, which are in accordance with the MIDI 1.0 Specification of the MIDI Manufacturers Association (MMA). The use of the MIDI standard ensures that all of the connected MIDI devices work together in harmony.

For example, sequence control signals of the sequence controller 9 can be converted into sequences of ten successive bits (one start bit, eight data bits, and one stop bit), where the eight data bits are able to encode different MIDI commands. In particular, at least the MIDI control signals START, CONTINUE and STOP, as well as the corresponding "timing clock", which is sent for example 24 times per quarter note, are implemented in the present example. In the event of interruptions to the magnetic resonance sequence or the magnetic resonance protocol, for example, this also enables noise outputs of the at least one further instrument device 13 to be interrupted.

The magnetic resonance scanner 2, by the operation of the gradient coil arrangement 3 and the at least one further instrument device 13, in combination create an overall acoustic combination or composition in the form of a music piece in which the noise 7 of the gradient coil arrangement 3 is merged with noise 17 of the at least one further instrument device 13, such that a harmonic music piece is produced that the patient 4 perceives more positively than the noise 7 of the gradient coil arrangement 3 alone.

Use is made here of the knowledge that, due to the regular time sequence of any magnetic resonance sequence, the noise 7 has a repetitive acoustic pattern that has a period corresponding to the repetition time TR, for example similar to a drumming, banging or hammering. In the musical mode of expression, the noise 7 can be associated with musical descriptors such as beat, tempo, pitch or rhythm.

The magnetic resonance apparatus 1 illustrated here uses a parallel audio channel in order to superimpose the noise 17 synchronously to the noise 7. The noise 17 can add musical descriptors with regard to the basic melody, such as chords, progressions, octaves, timbre, and the like, in order to create an overall acoustic combination, wherein the noise synthesizer formed by the audio amplifier and the speaker 15 is configured in the slave mode so as to emit as an output the music piece driven by the MIDI synchronization signals and/or music control signals of the synchronization unit 12.

Music control signals of the synchronization unit 12 can in this case also describe the noise 17 that is actually to be emitted, i.e. its output can extend beyond simple synchronization commands, as described, particularly when the control computer 8 is also designed to specify the music piece itself on the basis of the gradient pulses that are to be produced. In this case there are essentially two possibilities. First, the musical descriptors of the noise 7 can be derived, as explained, in order to generate a model of the noise 7, for which compatible music pieces can be retrieved from a musical database, to which retrieval music pieces corresponding data are then assigned for synchronization purposes. At the same time, patient preferences, for example with respect to musical genres, can be taken into consideration.

Alternatively or in addition, it is also conceivable to produce the music piece in the control computer 8 itself, for example on the basis of generally known generation algorithms, so that ultimately a kind of personalized magnetic resonance soundtrack is produced. In this case, too, it is possible to have recourse to external resources as appropriate.

It should also be noted that the tempo at which the synchronization signals are emitted is not necessarily required to correspond to the repetition rate resulting from the repetition time, but rather a division or multiplication can be performed by the synchronization unit 12, for example using a PLL circuit, as rate matching. In other words, the synchronization unit 12 is designed to match the rate of the output of the synchronization signals as a function of a tempo of the pulse of the music piece, starting from the repetition time described by the sequence control signals.

The connected light generation device 16 can in this case serve to present a suitable visual backdrop to the music piece. It can also be used selectively in order to conjure, in combination with the music, specific emotional states that are beneficial as stimulation, for example during a functional magnetic resonance imaging (fMRI) examination.

Figure 2:
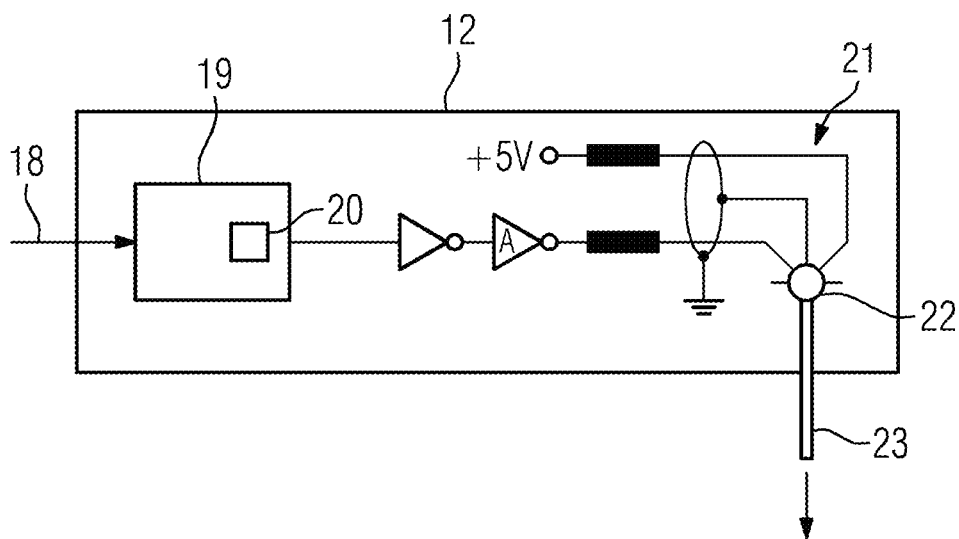
FIG. 2 shows a synchronization unit according to the invention.

FIG. 2 shows a circuit schematic of an exemplary specific embodiment of the synchronization unit 12, which receives sequence control signals via an input according to the arrow 18. These initially pass through a control module 19, which can be an FPGA circuit and/or a microcontroller. In this arrangement, the control module 19 has a UART 20 that establishes the realtime capability. The output signals of the control module 19 are converted by a converter circuit 21 into the standardized MIDI synchronization signals and music control signals so that they can be transmitted via a corresponding MIDI port 22 to a MIDI cable 23, and into the music network 11.

Furthermore, the music network 11 can also be used to adjust the volume in preparation for a jump in volume that occurs during the magnetic resonance examination, for example during the transition from one magnetic resonance sequence to another. By a typical increase in the volume it is possible to adjust the acoustic impedance of the ears of the patient 4 as a preparatory measure in order to avoid alarming the patient 4.

Figure 3:
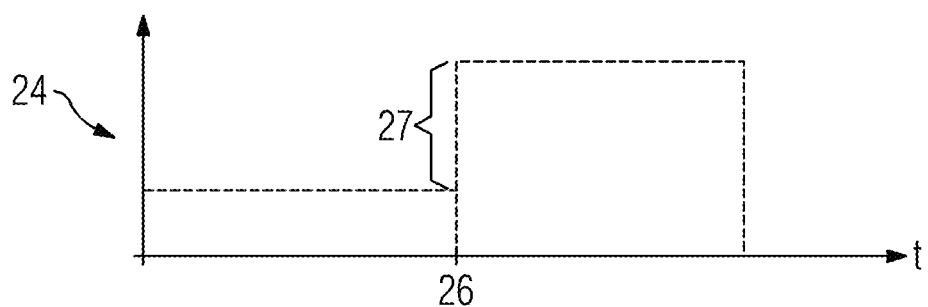
FIG. 3 shows graphs to explain matching of the acoustic impedance of a patient's ears.

This is illustrated in more detail in FIG. 3, which shows the expected, precalculated volume curve of the noise 7 in the upper graph 24, and the volume curve of the noise 17 in the lower graph 25. As can be seen, a sudden jump in volume 17 occurs at a point in time 26 due to a change of magnetic resonance sequence, for example from an EPI sequence to a TSE sequence. The hearing of the patient 4 can be prepared for this jump in volume by the choice, for a musical theme of the noise 17 used for the second sequence, of a smoothly, in this case linearly, increasing volume at the edge 28, which, for familiarizing the patient 4, has already reached the high level at the point in time 26.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) apparatus comprising:
an MR data acquisition scanner having an opening therein adapted to receive a patient, said MR data acquisition scanner further comprising a gradient coil arrangement;
a control computer configured to provide control signals to said MR data acquisition scanner in order to operate the MR data acquisition scanner so as to execute an MR data acquisition sequence, said control signals including gradient control signals that operate said gradient coil arrangement in said sequence so as to cause said gradient coil arrangement to emit audible sound having a volume that increases from a lower volume to a higher volume during the execution of the MR data acquisition sequence;
a music network comprising at least two instrument devices that operate in combination so as to emit a musical piece as an audible output to the patient, wherein one of said instrument devices is said MR data acquisition scanner and wherein said music piece comprises said audible sounds emitted by said gradient coil arrangement; and
a synchronization processor serving as an interface between said music network and said control computer, said synchronization processor being configured to derive synchronization signals from said gradient control signals and to provide said synchronization signals to said at least two instrument devices so as to operate said at least two instrument devices in synchronization in order to emit said music piece,
wherein the synchronization signals cause the contribution to the music piece emitted by the at least two instrument devices to progressively increase over time such that, when the audible sound increases from the lower volume to the higher volume during the execution of the MR data acquisition sequence, the volume of the music piece already matches the higher volume of the audible sound of the gradient coil arrangement.

2. An MR apparatus as claimed in claim 1 wherein said music network is configured to communicate with said at least two instrument devices according to the Musical Instrument Digital Interface (MIDI) standard.

3. An MR apparatus as claimed in claim 1 wherein said control computer comprises a sequence controller that transmits said sequence control signals to said MR data acquisition scanner as Transistor-Transistor-Logic (TTL) trigger signals.

4. An MR apparatus as claimed in claim 1 wherein said synchronization processor is configured to generate music control signals in order to operate at least one instrument device of said at least two instrument devices, other than said instrument device formed by said MR data acquisition scanner, as or in addition to said synchronization signals.

5. An MR apparatus as claimed in claim 4 wherein said MR data acquisition scanner is configured to operate as a master component in said music network and other instrument devices, in said at least two instruments devices, are configured to operate as slave components of said music network.

6. An MR apparatus as claimed in claim 4 wherein said synchronization unit is configured to generate said music control signals so as to comprise at least one command selected from the group consisting of a start command, an end command, a pause command, and continue command, in unison with occurrence of said audible noise emitted by said gradient coil arrangement during execution of said MR data acquisition sequence.

7. An MR apparatus as claimed in claim 4 wherein at least one of said control computer or said synchronization processor is configured to determine said musical piece dependent on said audible sound emitted by said gradient coil arrangement, and wherein said synchronization processor is configured to generate and emit music control signals, to at least one instrument device of said at least two instrument devices, other than said instrument device formed by said MR data acquisition scanner, conforming to the determined music piece.

8. An MR apparatus as claimed in claim 7 wherein said control computer is configured to derive said music piece by executing a generation algorithm that uses said gradient control signals as an input to said generation algorithm.

9. An MR apparatus as claimed in claim 7 wherein said control computer is configured to determine said music piece by selecting said music piece from a database comprising a plurality of available music pieces, dependent on said gradient control signals.

10. An MR apparatus as claimed in claim 1 wherein said sequence control signals operate said MR data acquisition scanner so as to execute said MR data acquisition sequence with a repetition time, and wherein said synchronization processor is configured to match a rate of emission of said synchronization signals, as a tempo of said music piece, with a time interval that is a multiple of said repetition time, or with said repetition time being a multiple of said time interval.

11. An MR apparatus as claimed in claim 1 comprising a light generator and emitter that is also provided with said synchronization signals from said synchronization processor, in order to emit light coordinated with said music piece.

12. An MR apparatus as claimed in claim 1 wherein said synchronization processor comprises a Field Programmable Gate Array (FPGA) circuit that processes said sequence control signals, said FPGA circuit comprising a Universal Asynchronous Receiver/Transmitter (UART).

13. An MR apparatus as claimed in claim 1 wherein said synchronization processor comprises a Universal Asynchronous Receiver/Transmitter (UART).

14. An MR apparatus as claimed in claim 1 wherein at least one of said at least two instrument devices, other than said instrument device formed by said MR data acquisition scanner, comprises an audio amplifier with a speaker connected thereto.

15. A method for operating a magnetic resonance (MR) apparatus, said MR apparatus comprising an MR data acquisition scanner adapted to receive a patient therein, and said MR data acquisition apparatus further comprising a gradient coil arrangement, said method comprising:
using a control computer to provide control signals to said MR data acquisition scanner in order to operate the MR data acquisition scanner so as to execute an MR data acquisition sequence, said control signals including gradient control signals that operate said gradient coil arrangement in said sequence so as to cause said gradient coil arrangement to emit audible sound having a volume that increases from a lower volume to a higher volume during the execution of the MR data acquisition sequence;
using a music network comprising at least two instrument devices that operate in combination so as to emit a musical piece as an audible output to the patient, and using said MR data acquisition scanner as one of said instrument devices so that said music piece comprises said audible sounds emitted by said gradient coil arrangement; and using a synchronization processor as an interface between said music network and said control computer, and in said synchronization processor, deriving synchronization signals from said gradient control signals, and providing said synchronization signals to said at least two instrument devices so as to operate said at least two instrument devices in synchronization in order to emit said music piece, wherein the synchronization signals cause the contribution to the music piece emitted by the at least two instrument devices to progressively increase over time such that, when the audible sound increases from the lower volume to the higher volume during the execution of the MR data acquisition sequence, the volume of the music piece already matches the higher volume of the audible sound of the gradient coil arrangement.

16. An MR apparatus as claimed in claim 1 wherein the synchronization signals cause the contribution to the music piece emitted by the at least two instrument devices to progressively increase over time in a linear manner.

17. An MR apparatus as claimed in claim 4, wherein at least one of said control computer or said synchronization processor is configured to determine the musical piece by generating a model having musical descriptors including one or more of beat, tempo, pitch, and rhythm associated with the audible sound emitted by the gradient coil arrangement, and selecting the musical piece from among a database of annotated musical pieces having musical descriptors matching those of the generated model.

18. An MR apparatus as claimed in claim 1, wherein the light generator and emitter are configured, in response to receiving synchronization signals from the synchronization processor, to emit light synchronized with an MR examination performed via the MR data acquisition scanner.

* * * * *